United States Patent
Cho et al.

(10) Patent No.: US 7,741,200 B2
(45) Date of Patent: Jun. 22, 2010

(54) FORMATION AND TREATMENT OF EPITAXIAL LAYER CONTAINING SILICON AND CARBON

(75) Inventors: Yonah Cho, Sunnyvale, CA (US); Yihwan Kim, Milpitas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 194 days.

(21) Appl. No.: 11/778,212

(22) Filed: Jul. 16, 2007

(65) Prior Publication Data

US 2008/0131619 A1 Jun. 5, 2008

Related U.S. Application Data (63) Continuation-in-part of application No. 11/566,058, filed on Dec. 1, 2006, now abandoned.

(51) Int. Cl.
H01L 21/425 (2006.01)
(52) U.S. Cl. ............... 438/530; 438/308; 257/E21.435
(58) Field of Classification Search ................ 438/308, 438/530; 257/E21.435
See application file for complete search history.

(56) References Cited

U.S. PATENT DOCUMENTS

| | | | |
|---|---|---|---|
| 5,015,595 A * | 5/1991 | Wollesen | ................ 438/231 |
| 5,108,792 A | 4/1992 | Anderson et al. | |
| 5,179,677 A | 1/1993 | Anderson | |
| 5,186,718 A | 2/1993 | Tepman et al. | |
| 6,380,044 B1 * | 4/2002 | Talwar et al. | ................ 438/308 |
| 6,803,297 B2 | 10/2004 | Jennings et al. | |
| 6,821,825 B2 | 11/2004 | Todd et al. | |
| 6,897,131 B2 | 5/2005 | Ramachandran et al. | |
| 6,916,398 B2 | 7/2005 | Chen et al. | |
| 6,998,153 B2 | 2/2006 | Chiang et al. | |
| 7,122,435 B2 | 10/2006 | Chidambaram et al. | |
| 7,132,338 B2 | 11/2006 | Samoilov et al. | |
| 2003/0040130 A1 * | 2/2003 | Mayur et al. | ................ 438/14 |
| 2004/0224089 A1 | 11/2004 | Singh et al. | |
| 2005/0079691 A1 | 4/2005 | Kim et al. | |
| 2006/0115933 A1 | 6/2006 | Ye et al. | |
| 2006/0115934 A1 | 6/2006 | Kim et al. | |
| 2006/0216876 A1 | 9/2006 | Kim et al. | |
| 2006/0234488 A1 | 10/2006 | Kim et al. | |
| 2006/0240630 A1 | 10/2006 | Bauer et al. | |
| 2008/0014698 A1 | 1/2008 | Prall et al. | |

OTHER PUBLICATIONS

Bauer, M., "Tensile Strained Selective Silicon Carbon Alloys for Recessed Source Drain Areas of Devices", *Abstract 210th ECS Meeting* Oct. 29, through Nov. 3, 2006.

Mitchell, T. O., et al., "Substitutional Carbon Incorporation in Epitaxial Si1-yCy Layers Grown by Chemical Vapor Deposition", *Appl. Phys. Lett.* 71(12), (Sep. 22, 1997),1688-1690.

"USPTO Non-Final Office Action mailed Sep. 22, 2008—U.S. Appl. No. 11/566,058, filed Dec. 1, 2006" 17 pgs.

"USPTO Final Office Action mailed Apr. 1, 2009 for U.S. Appl. No. 11/566,058, filed Dec. 1, 2006", 11 pgs.

* cited by examiner

*Primary Examiner*—Bradley K Smith
(74) *Attorney, Agent, or Firm*—Diehl Servilla LLC (57) ABSTRACT

Methods for formation and treatment of epitaxial layers containing silicon and carbon are disclosed. Treatment converts interstitial carbon to substitutional carbon in the epitaxial layer, according to one or more embodiments. Specific embodiments pertain to the formation and treatment of epitaxial layers in semiconductor devices, for example, Metal Oxide Semiconductor Field Effect Transistor (MOSFET) devices. In specific embodiments, the treatment of the epitaxial layer involves annealing for short periods of time, for example, by laser annealing, millisecond annealing, rapid thermal annealing, spike annealing and combinations thereof. Embodiments include amorphization of at least a portion of the epitaxial layer containing silicon and carbon.

22 Claims, 5 Drawing Sheets

— Starting Epi
- - - - P12 IMPLANT
- - - - P12 IMPLANT + 1050 SPIKE

FIG. 5

— Starting Epi
- - - - P12 IMPLANT + 1100 DSA
- - - P12 IMPLANT + 1200 DSA
— — P12 IMPLANT + 1300 DSA

FORMATION AND TREATMENT OF EPITAXIAL LAYER CONTAINING SILICON AND CARBON

RELATED APPLICATION

This application is a continuation-in-part of applicant's U.S. patent application Ser. No. 11/566,058, filed Dec. 1, 2006, which is incorporated herein by reference in its entirety.

BACKGROUND

Embodiments of the present invention generally relate to formation and treatment of epitaxial layers containing silicon and carbon (Si:C). Specific embodiments pertain to the formation and treatment of epitaxial layers in semiconductor devices, for example, Metal Oxide Semiconductor Field Effect Transistor (MOSFET) devices.

Typically, a Metal Oxide Semiconductor (MOS) transistor includes a semiconductor substrate, a source, a drain, and a channel positioned between the source and drain on the substrate, which is usually made from silicon. Normally, a gate stack is located above the channel, the gate stack being composed of a gate oxide layer or gate electrode located directly above the channel, a gate conductor material above the gate oxide layer, and sidewall spacers. The sidewall spacers protect the sidewalls of the gate conductor. The gate electrode is generally formed of doped polysilicon (Si) while the gate dielectric material may comprise a thin layer (e.g., <20 Å) of a high dielectric constant material (e.g., a dielectric constant greater than 4.0) such as silicon dioxide ($SiO_2$) or nitrogen-doped silicon dioxide, and the like.

The amount of current that flows through the channel of a MOS transistor is directly proportional to a mobility of carriers in the channel, and the use of high mobility MOS transistors enables more current to flow and consequently faster circuit performance. Mobility of the carriers in the channel of an MOS transistor can be increased by producing a mechanical stress in the channel. A channel under compressive strain, for example, a silicon-germanium channel layer grown on silicon, has significantly enhanced hole mobility to provide a pMOS transistor. A channel under tensile strain, for example, a thin silicon channel layer grown on relaxed silicon-germanium, achieves significantly enhanced electron mobility to provide an nMOS transistor.

An nMOS transistor channel under tensile strain can also be provided by forming one or more carbon-doped silicon epitaxial layers in the source and drain region, which may be complementary to the compressively strained channel formed by SiGe source and drain in a pMOS transistor. Thus, carbon-doped silicon and silicon-germanium epitaxial layers can be deposited on the source/drain of nMOS and pMOS transistors, respectively. The source and drain areas can be either flat or recessed by selective Si dry etching. When properly fabricated, nMOS sources and drains covered with carbon-doped silicon epitaxy imposes tensile stress in the channel and increases nMOS drive current.

To achieve enhanced electron mobility in the channel of nMOS transistors having a recessed source/drain using carbon-doped silicon epitaxy, it is desirable to selectively form the carbon-doped silicon epitaxial layer on the source/drain either through selective deposition or by post-deposition processing. Furthermore, it is desirable for the carbon-doped silicon epitaxial layer to contain substitutional C atoms to induce tensile strain in the channel. Higher channel tensile strain can be achieved with increased substitutional C content in a carbon-doped silicon source and drain. However, most of C atoms incorporated through typical selective Si:C epitaxy processes (for example at process temperature >700° C.) occupy non-substitutional (i.e. interstitial) sites of the Si lattice. By lowering growth temperature, a higher fraction of substitutional carbon level can be achieved (e.g. nearly 100% at growth temperature of 550° C.), however, the slow growth rate at these lower temperatures is undesirable for device applications, and such selective processing might not be possible at the lower temperatures.

Therefore, there is a need to provide methods to improve the substitutional carbon content in carbon-doped silicon epitaxial layers. Such methods would be useful in the manufacture of transistor devices.

SUMMARY

One embodiment of the present invention relates to methods of forming and processing epitaxial layers containing silicon and carbon. Other embodiments relate to methods manufacturing of fabricating transistor devices including epitaxial layers containing silicon and carbon. In specific embodiments, methods are provided to form nMOS transistors containing n-doped Si:C with high substitutional carbon levels.

In accordance with one embodiment of the present invention, a method of treating an epitaxial layer containing silicon and carbon on a substrate is provided, which comprises providing a substrate having an epitaxial layer containing carbon and silicon deposited on the substrate, the carbon including interstitial carbon; and annealing the substrate and epitaxial layer at a temperature from about 800° C. to about 1350° C. to convert at least a portion of the interstitial carbon in the epitaxial layer to substitutional carbon. According to one embodiment, the combined total amount of substitutional carbon (if present initially) and interstitial carbon is greater than about 0.5 atomic percent, and in specific embodiments, greater than about 1 atomic percent, and more particularly, greater than about 2 atomic percent.

According to certain embodiments, the method may further comprise ion implanting the epitaxial layer. The ion implantation may result in amorphization of at least a portion of the epitaxial layer. Amorphization can be achieved by typical amorphization procedures, including pre-amorphization (e.g. using Si) implantation. As used herein, amorphization implant refers to an implanting process that causes amorphization of at least part of the epitaxial layer. In another embodiment, the epitaxial layer is formed in the source and drain area of a device. In device embodiments including a source and drain, ion implantation can include the same conditions used to form deep source and drain junctions or deep source and drain implants accompanied with a pre-amorphization implant to increase substitutional carbon in the epitaxial layer. In embodiments that include amorphization, the annealing can be performed by one or more of dynamic surface annealing, laser annealing, millisecond annealing, flash annealing or spike annealing. In one or more embodiments, the annealing occurs for less than 10 seconds. In other embodiments, the annealing occurs for less than 900 milliseconds. For example, the annealing may be performed by laser annealing or millisecond annealing for less than 900 milliseconds, for example less than 10 milliseconds. According to one or more embodiments, the overall sequence, implant conditions and anneal conditions are chosen to maximize substitutional carbon in the epitaxial layer.

In other embodiments, the annealing is performed by laser annealing or millisecond annealing for less than 900 milliseconds followed by rapid thermal annealing for less than 10 seconds. In still other embodiments, the annealing is performed by rapid thermal annealing for less than 10 seconds followed by laser annealing or millisecond annealing for less than 10 seconds.

Methods of forming Si:C epitaxial films may be utilized during a fabrication step of transistor manufacturing process. Embodiments of the invention pertain to a method of manufacturing a transistor comprising forming a gate dielectric on a substrate; forming a gate electrode on the gate dielectric; forming source/drain regions on the substrate having a second conductivity on opposite sides of the electrode and defining a channel region between the source/drain regions; depositing an epitaxial layer containing silicon and carbon directly on the source/drain regions, a portion of the carbon being substitutional carbon, the remainder of the carbon being interstitial carbon; and annealing the substrate and epitaxial layer at a temperature from about 800° C. to about 1350° C. convert at least a portion of the interstitial carbon in the epitaxial layer to substitutional carbon. In certain embodiments, the combined total amount of substitutional carbon and interstitial carbon is greater than about 0.5 atomic percent, and in specific embodiments, greater than about 1 atomic percent, and in more specific embodiments greater than about 2 atomic percent. The amount of interstitial and substitutional carbon may be in a range of between about 0.5 and 2 atomic percent.

In certain embodiments, the method of making a transistor may further comprise ion implantation into the epitaxial layer followed by annealing. The annealing may be performed by one or more of millisecond annealing (such as dynamic surface annealing, laser surface annealing, or flash annealing) or rapid thermal anneal (such as spike annealing). Variations of annealing described above may be utilized to manufacture a transistor. The overall sequence, implant conditions and anneal conditions are chose to maximize the substitutional carbon content according to embodiments of the invention.

The foregoing has outlined rather broadly certain features and technical advantages of the present invention. It should be appreciated by those skilled in the art that the specific embodiments disclosed may be readily utilized as a basis for modifying or designing other structures or processes within the scope present invention. It should also be realized by those skilled in the art that such equivalent constructions do not depart form the spirit and scope of the invention as set forth in the appended claims.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the invention generally provide a method of forming and treating an epitaxial layer containing silicon and carbon. Other embodiments pertain to a method of manufacturing a transistor.

In particular embodiments, methods of forming Si:C in source and drain regions of nMOS transistor are provided. In specific embodiments, high substitutional C is maintained for high channel strain while Si:C is highly doped with n-dopant (e.g. P, As, or combination thereof for nMOS transistors. Post-epitaxial ion implantation procedures cause implant-induced damage and degrades the Si:C epitaxial layer. Implant-induced damage results in crystallinity defects as well as loss of substitutional C, which is directly related to channel strain or channel mobility, and hence, device performance. It would be desirable to provide methods which minimize loss of substitutional C, or alternatively, recover lost substitutional C by post-implantation processes, for example, advanced anneal such as milli-second anneal such as Dynamic Surface Anneal (DSA), laser surface anneal, or flash anneal. Experimentation revealed that conventional spike anneal used for dopant activation did not alone recover substitutional C, but millisecond laser anneal, in particular, DSA, is very effective at recovering lost substitutional C and even increasing substitutional C to the level greater than that in starting epitaxial layer prior to implantation processes. According to one or more embodiments of the invention, levels of substitutional C from either as-deposited level or from after implantation level are increased.

The method of forming and treating an epitaxial layer comprises providing a substrate having an epitaxial layer containing carbon and silicon deposited on the substrate, the carbon including interstitial carbon; and annealing the substrate and epitaxial layer at a temperature from about 800° C. to about 1350° C. to convert at least a portion of the interstitial carbon in the epitaxial layer to substitutional carbon. In one embodiment, the method of manufacturing a transistor comprises forming a gate dielectric on a substrate; forming a gate electrode on the gate dielectric; forming source/drain regions on the substrate having a second conductivity on opposite sides of the electrode and defining a channel region between the source/drain regions; depositing an epitaxial layer containing silicon and carbon directly on the source/drain regions, the carbon including interstitial carbon; and annealing the substrate and epitaxial layer at a temperature from about 800° C. to about 1350° C. to convert at least a portion of the interstitial carbon in the epitaxial layer to substitutional carbon. Epitaxial layers are distinguished from bulk substrates and polysilicon layers.

As used herein, epitaxial deposition refers to the deposition of a single crystal layer on a substrate, so that the crystal structure of the deposited layer matches the crystal structure of the substrate. Thus, an epitaxial layer or film is a single crystal layer or film having a crystal structure that matches the crystal structure of the substrate.

According to embodiments of the invention, the processing of the epitaxial films containing carbon and silicon increases substitutional C content of the film. Substitutional C content in the Si:C layer can be increased by converting as-deposited non-substitutional C atoms to substitutional Si lattice sites. Although the present invention is not intended to be bound by any particular theory, it is believed that such conversion of non-substitutional (or interstitial) C atoms to substitutional sites may be related to distribution of point defects such as vacancies, self interstitials, and other foreign interstitials as well as defect clusters. By changing initial (as-deposited) defect distribution and Si lattice to a structure favorable for more C atoms to occupy substitutional sites, the substitutional C content can be increased. It will be understood that reference to increasing the amount of substitutional carbon is not intended to limit the invention to as-deposited films that containing substitutional carbon. According to embodiments of the invention, the initially deposited epitaxial film may contain no substitutional carbon, and according to embodiments of the present invention, the film comprising interstitial carbon is treated to reduce the amount of interstitial carbon and to increase the substitutional carbon from zero in the as-deposited film. Such structural change and increase in substitutional C content can be achieved by the process sequences described herein.

In one or more embodiments, an epitaxial film containing silicon and carbon is formed and treated by implantation and annealing as described further below. The epitaxial films may be formed by selective or non-selective epitaxial layer deposition.

In one or more embodiments, an increase in substitutional C content can be achieved by combination of implantation and anneal in the following exemplary process sequence: (1) Deposition of epitaxial layer(s) containing silicon and carbon with high total C concentration for example, greater than about 0.5 atomic %, or greater than about 1 atomic %) by selective or non-selective deposition process; (2) Amorphization of the epitaxial layer containing silicon and carbon, for example, by implantation of an ion, such as Si. It is generally desired that the energy and dose are such that at least a portion of the epitaxial layer is amorphized without lattice crystallinity after the implantation; and (3) Annealing for less than 60 seconds, for example, dynamic surface anneal, millisecond anneal or laser anneal, dynamic surface anneal (DSA) chamber. In one or more embodiments, the anneal temperature can be above 1000° C. with various scan speed (or resident time) in the range of 10 s and 100 s mm/s. According to one or more embodiments, the methods to follow the sequential order, however, the process is not limited to the exact steps recited above. For example, other process steps can be inserted between steps as long as the order of process sequence is maintained. The individual steps of the process will now be described according to one or more embodiments.

The Substrate

The substrate is typically a silicon substrate, and it can be a patterned substrate. Patterned substrates are substrates that include electronic features formed into or onto the substrate surface. The patterned substrate may contain monocrystalline surfaces and at least one secondary surface that is non-monocrystalline, such as polycrystalline or amorphous surfaces. Monocrystalline surfaces include the bare crystalline substrate or a deposited single crystal layer usually made from a material such as silicon, silicon germanium or silicon carbon. Polycrystalline or amorphous surfaces may include dielectric materials, such as oxides or nitrides, specifically silicon oxide or silicon nitride, as well as amorphous silicon surfaces.

Epitaxial Deposition

The silicon carbon layer may be deposited using an epitaxial process in a suitable processing chamber such as an Epi RP or Centura, both of which are available from Applied Materials, Santa Clara, Calif. Generally, the process chamber is maintained at a consistent temperature throughout the epitaxial process. However, some steps may be performed at varying temperatures. The process chamber is kept at a temperature in the range from about 250° C. to about 1,000° C., for example, from about 500° C. to about 900° C. The appropriate temperature to conduct the epitaxial process may depend on the particular precursors used to deposit and/or etch the silicon and carbon-containing materials, and can be determined by a person skilled in the art. The process chamber is usually maintained at a pressure from about 0.1 Torr to about 200 Torr, the pressure may fluctuate during and between this deposition step, but is generally constant.

During the epitaxial deposition process, the substrate is exposed to a deposition gas to form an epitaxial layer on the monocrystalline surface while forming a polycrystalline layer on the secondary surfaces. The specific exposure time of the deposition process is determined in relation to the exposure time during the etching process, as well as particular precursors and temperature used in the process. Generally, the substrate is exposed to the deposition gas long enough to form a maximized thickness of an epitaxial layer while forming a minimal thickness of a polycrystalline layer that may be easily etched away during deposition.

The deposition gas contains at least a silicon source, a carrier gas, and a carbon source. In an alternative embodiment, the deposition gas may include at least one etchant, such as hydrogen chloride or chlorine.

The silicon source is usually provided into the process chamber at a rate in a range from about 5 sccm to about 500 sccm, for example, from about 10 sccm to about 300 sccm, and specifically from about 50 sccm to about 200 sccm, more specifically, about 100 sccm. Silicon sources useful in the deposition gas to deposit silicon and carbon-containing compounds include, but not limited to, silanes, halogenated silanes and organosilanes. Silanes include silane ($SiH_4$) and higher silanes with the empirical formula $Si_xH_{(2x+2)}$, such as disilane ($Si_2H_6$), trisilane ($Si_3H_8$), and tetrasilane ($Si_4H_{10}$), as well as others. Halogenated silanes include compounds with the empirical formula $X'_y Si_x H_{(2x+2-y)}$, where $X'$=F, Cl, Br or I, such as hexachlorodisilane ($Si_2Cl_6$), tetrachlorosilane ($SiCl_4$), dichlorosilane ($Cl_2SiH_2$) and trichlorosilane ($Cl_3SiH$). Organosilanes include compounds with the empirical formula $R_y Si_x H_{(2x+2-y)}$, where R=methyl, ethyl, propyl or butyl, such as methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$) and hexamethyidisilane (($CH_3$)$_6Si_2$).

The silicon source is usually delivered into the process chamber along with a carrier gas. The carrier gas has a flow rate from about 1 slm (standard liters per minute) to about 100 slm, for example, from about 5 slm to about 75 slm, and specifically from about 10 slm to about 50 slm, for example, about 25 slm. Carrier gases may include nitrogen ($N_2$), hydrogen ($H_2$), argon, helium and combinations thereof. An inert carrier gas is preferred and includes nitrogen, argon, helium and combinations thereof. A carrier gas may be selected based on the precursor(s) used and/or the process temperature during the epitaxial process 120. Usually the carrier gas is the same theoughout each step. However, some embodiments may use different carrier gases in particular steps.

The carbon source provided to the process chamber during step 120 with the silicon source and carrier gas to form a silicon and carbon-containing compound, such as a silicon carbon material, is usually provided into the process chamber at a rate in the range from about 0.1 sccm to about 20 sccm, for example, from about 0.5 sccm to about 10 sccm, and more specifically from about 1 sccm to about 5 sccm, for example, about 2 sccm. Carbon sources useful to deposit silicon and carbon-containing compounds include, but not limited to, organosilanes, alkyls, alkenes and alkynes of ethyl, propyl and butyl. Such carbon sources include methylsilane ($CH_3SiH_3$), dimethylsilane (($CH_3)_2SiH_2$), trimethylsilane (($CH3)3SiH$), ethylsilane ($CH_3CH_2SiH_3$), methane ($CH_4$), ethylene ($C_2H_4$), ethyne ($C_2H_2$), propane ($C_3H_8$), propene ($C_3H_6$), butyne ($C_4H_6$), as well as others. The carbon concentration of an epitaxial layer is in the range from about 200 ppm to about 5 atomic %, for example, from about 1 atomic % to about 3 atomic %, more specifically at least about 2 atomic % or at least about 1.5 atomic %. In one embodiment, the carbon concentration may be graded within an epitaxial layer, preferably graded with a higher carbon concentration in the lower portion of the epitaxial layer than in the upper portion of the epitaxial layer. Alternatively, a germanium source and a carbon source may both be added into the process chamber with the silicon source and carrier gas to form a silicon and carbon-containing compound, such as a silicon germanium carbon material.

The deposition process is terminated. In one example, the process chamber may be flushed with a purge gas or the carrier gas and/or the process chamber may be evacuated with a vacuum pump. The purging and/or evacuating processes remove excess deposition gas, reaction by-products and other contaminates. In another example, once the deposition process has terminated, the etching process is immediately started without purging and/or evacuating the process chamber.

Etching

An optional etching process may be performed. The etching process removes a portion of the epitaxial layer on the substrate surface. The etching process removes both epitaxial or monocrystalline materials and amorphous or polycrystalline materials. Polycrystalline layers, if any, deposited on the substrate surface are removed at a faster rate than the epitaxial layers. The time duration of the etching process is balanced with the time duration of the deposition process to result in net deposition of the epitaxial layer selectively formed on desired areas of the substrate. Therefore, the net result of the deposition process and etching process to form selective and epitaxially grown silicon and carbon-containing material while minimizing, if any, growth of polycrystalline material.

During the etching process, the substrate is exposed to the etching gas for a period of time in the range from about 10 seconds to about 90 seconds, for example, from about 20 seconds to about 60 seconds, and more specifically from about 30 seconds to about 45 seconds. The etching gas includes at least one etchant and a carrier gas. The etchant is usually provided into the process chamber at a rate in the range from about 10 sccm to about 700 sccm, for example from about 50 sccm to about 500 sccm, The etchant used in the etching gas may include chlorine ($Cl_2$), hydrogen chloride (HCl), boron trichloride ($BCl_3$), methylchloride (CH3Cl), carbon tetrachloride ($CCl_4$), chlorotrifluoride ($ClF_3$) and combinations thereof. Preferably, chlorine or hydrogen chloride is used as the etchant.

The etchant is usually provided into the process chamber with a carrier gas. The carrier gas has a flow rate in the range from about 1 slm to about 100 slm, for example, from about 5 slm to about 75 slm, and more specifically from about 10 slm to about 50 slm, for example, about 25 slm. Carrier gases may include nitrogen ($N_2$), hydrogen ($H_2$), argon, helium and combinations thereof. In some embodiment, an inert carrier gas is preferred and includes nitrogen, argon, helium and combinations thereof. A carrier gas may be selected based upon specific precursor(s) and/or temperature used during the epitaxial process.

The etching process is terminated. In one example, the process chamber may be flushed with a purge gas or the carrier gas and/or the process chamber may be evacuated with a vacuum pump. The purging and/or evacuating processes remove excess etching gas, reaction by-products and other contaminates. In another example, once the etching process has terminated, the thickness of the epitaxial layer is immediately started without purging and/or evacuating the process chamber.

The thicknesses of the epitaxial layer and the polycrystalline layer may be determined. If the predetermined thicknesses are achieved, then epitaxial process is terminated. However, if the predetermined thicknesses are not achieved, then the deposition process is repeated as a cycle until the desired thicknesses are achieved. The epitaxial layer is usually grown to have a thickness at a range from about 10 Å to about 2,000 Å, for example, from about 100 Å to about 1,500 Å, and more specifically from about 400 Å to about 1,200 Å, for example, about 800 Å. The polycrystalline layer is usually deposited with a thickness, if any, in a range from an atomic layer to about 500 Å. The desired or predetermined thickness of the epitaxial silicon and carbon-containing layer or the polycrystalline silicon and carbon-containing layer is specific to a particular fabrication process. In one example, the epitaxial layer may reach the predetermined thickness while the polycrystalline layer is too thick.

Dopant Exposure During Deposition (or In-Situ Doping)

During epitaxial deposition, the epitaxial layer may optionally be exposed to a dopant. Typical dopants may include at least one dopant compound to provide a source of elemental dopant, such as boron, arsenic, phosphorous, gallium or aluminum. Dopants provide the deposited silicon and carbon-containing compounds with various conductive characteristics, such as directional electron flow in a controlled and desired pathway required by the electronic device. Films of the silicon and carbon-containing compounds are doped with particular dopants to achieve the desired conductive characteristic. In one example, the silicon and carbon-containing compound is doped p-type, such as by using diborane to add boron at a concentration in the range from about $10^{15}$ atoms/cm$^3$ to about $10^{21}$ atoms/cm$^3$. In one example, the p-type dopant has a concentration of at least $5\times10^{19}$ atoms/cm$^3$. In another example, the p-type dopant is in the range from about $1\times10^{20}$ atoms/cm$^3$ to about $2.5\times10^{21}$ atoms/cm$^3$. In another example, the silicon and carbon-containing compound is doped n-type, such as with phosphorous and/or arsenic to a concentration in the range from about $5\times10^{19}$ atoms/cm$^3$ to about $5\times10^{21}$ atoms/cm$^3$.

A dopant source is usually provided into the process chamber during deposition. Boron-containing dopants useful as a dopant source include boranes and organoboranes. Boranes include borane, diborane ($B_2H_6$), triborane, tetraborane and pentaborane, while alkylboranes include compounds with the empirical formula $R_xBH_{(3-x)}$, where R=methyl, ethyl, propyl or butyl and x=1, 2 or 3. Alkylboranes include trimethylborane (($CH_3)_3B$), dimethylborane (($CH_3)_2BH$), triethylborane (($CH_3CH_2)_3B$) and diethylborane (($CH_3CH_2)_2BH$). Dopants may also include arsine ($AsH_3$), phosphine ($PH_3$) and alkylphosphines, such as with the empirical formula $R_xPH_{(3-x)}$, where R=methyl, ethyl, propyl or butyl and x=1, 2 or 3. Alkylphosphines include trimethylphosphine (($CH_3)_3P$), dimethylphosphine (($CH_3)_2PH$), triethylphosphine (($CH_3CH_2)_3P$) and diethylphosphine (($CH_3CH_2)_2PH$.

Ion Implantation

Ion implantation of the epitaxial layer is performed, which may result in amorphization of at least a portion of the epitaxial layer. Ion implantation may be used to form doped regions such as the source and the drain, which may result in amorphization of the epitaxial layer. For example, this may occur during the formation of lightly and highly doped drain regions or source drain extensions and deep source and drain as part of a transistor fabrication process. For n-type doping of transistor containing Si:C source/drain, the thickness of the doped regions would be decided by desired source/drain junction depth, which is typically less than 1000 Å. Implantation of Phosphorous, Arsenic, or combination of the two are typically used for Si:C source/drain for nMOS transistor. The peak dopant impurity concentration may be greater than $1\times10^{20}$ atoms/cm$^3$ or higher, and the doping dose may be equal or greater than $2\times10^{15}$/cm$^2$. In one or more embodiments, an additional amorphization step known as pre-amorphization may be performed with Si, Ge, or As ion implantation, however, other methods can be used. The amorphization depth is determined by ion energy of implanting species. As is known in the art, a minimum dose is required to cause amorphization of crystalline Si, for example, 1E15 cm$^2$ with Si implantation.

Amorphization implant and dopant implant of the epitaxial layer containing silicon and carbon may be achieved by in a Quantum X implanter available from Applied Materials, Santa Clara, Calif. Ion implantation amorphizes at least a portion of the initial Si:C epilayer (crystal structure) by displacing substitutional Si and C atoms to non-substitutional sites.

Annealing

According to one or more embodiments of the invention, the epitaxial layer is annealed. In specific embodiments, the annealing may take place for a relatively short period of time such as in a rapid thermal anneal or rapid thermal processing chamber. As used herein, rapid thermal annealing (RTA) and rapid thermal processing (RTP) both refer to a process that subjects a sample to a very short yet highly controlled thermal cycle that heats the sample from room temperature to a high temperature, for example, as high as 1200° C. The duration of the thermal cycle during a RTP or RTA process is typically less than about 60 seconds, and typically less than about 30 seconds. In certain embodiments, the duration of the RTP or RTA is less than about 20 seconds, 15 seconds, 10 seconds, or 5 seconds. Spike annealing refers to a process in which a sample is exposed to high temperatures for less than about 10 seconds or 5 seconds. For example, spike anneal may occur for less than about five seconds at high temperature of between about 800 degrees Celsius to 1200 degrees Celsius. Millisecond annealing refer to processes that subject a sample to a thermal cycle that heats the sample from room temperature to a high temperature, for example, as high as 1350° C., in less than about 900 milliseconds, and more typically less than about 500 milliseconds. In specific embodiments, the dwell time at high temperature above 1000° C. is less than about 5 milliseconds. Millisecond anneal can be achieved by laser anneal (such as Applied Material's Dynamic Surface Anneal), or flash anneal. As the name implies, laser annealing uses a laser to heat the sample.

The annealing process may include a rapid thermal process such as rapid thermal annealing, rapid thermal processing, millisecond annealing, and/or spike annealing or combinations thereof. The annealing temperature may depend on the process used. For example, spike annealing may have a temperature ranging between about 1000° C. and about 1100° C., preferably about 1050° C., while solid phase epitaxy may be performed at 500° C. or higher.

The annealing process may include a spike anneal, a type of rapid thermal process (RTP with an atmosphere of gas, such as oxygen, nitrogen, hydrogen, argon, helium or combinations thereof. The annealing process is conducted at a temperature from about 800° C. to about 1200° C., preferably from about 1050° C. to about 1100° C. The annealing process may occur immediately after the silicon and carbon-containing layer is deposited or after a variety of other process steps the substrate will endure.

In one embodiment, spike annealing is performed in an RTP system capable of maintaining gas pressure in the annealing ambient at a level significantly lower than the atmospheric pressure. An example of such an RTP system is the RADIANCE CENTURA® system commercially available from Applied Materials, Inc., Santa Clara, Calif. Spike annealing is further discussed in commonly assigned U.S. Pat. No. 6,897,131, issued May 24, 2005, entitled ADVANCES IN SPIKE ANNEAL PROCESSES FOR ULTRA SHALLOW JUNCTIONS and commonly assigned U.S. Pat. No. 6,803,297, issued Oct. 12, 2004 entitled OPTIMAL SPIKE ANNEAL AMBIENT, which are herein incorporated by reference to the extent they do not conflict with the current specification and claims.

It has been observed that millisecond or laser annealing above 1000° C. in Applied Materials DSA chamber/system provided excellent results: Millisecond or laser annealing provides sufficient energy to bring non-substitutional C atoms back to substitutional sites to increase the substitutional carbon content of the epitaxial layer. Examples of suitable DSA systems are disclosed in U.S. Pat. Nos. 6,987,240; 7,005,601; and 7,078,651, each of which is incorporated herein by reference.

The processes of the invention can be carried out in equipment known in the art. The apparatus may contain multiple gas lines to maintain the deposition gas and the other process gases prior to entering the process chamber. Thereafter, the gases are brought into contact with a heated substrate on which the silicon and carbon-containing compound films are grown. Hardware that can be used to deposit silicon and carbon-containing films includes the Epi Centura® system and the Poly Gen® system available from Applied Materials, Inc., located in Santa Clara, Calif. Other apparatuses include batch, high-temperature furnaces, as known in the art.

EXAMPLES

Example 1

A 300 mm bare silicon wafer was placed in a 300 mm Epi Centura reduced pressure chamber, available from Applied Materials, Inc. of Santa Clara, Calif. During a first processing step, a 500 Å thick undoped Si:C epitaxial film was deposited on the 300 mm bare silicon wafer. As-deposited Si:C film contained 2.3% total C, while 1.04% C was substitutional as indicated by film peak position around 1200 arcsec in high resolution X-ray diffractometer (HR-XRD) measurement in FIG. 1. During a second processing step, the film was then subjected to Si ion implantation at 25 keV ion energy and a dose of $1.5 \times 10^{15}$ cm$^2$ in Applied Materials' Quantum X implanter. Si implantation was performed to amorphize the Si:C epi layer. While as-deposited Si:C film shows HRXRD peak around 1200 arcsec corresponds to 1.04% substitutional C in the film, the Si:C film peak disappears after Si implantation. This is an indication of crystallinity loss or amorphization. Substitutional carbon was determined in this and the other Examples using Kelires model, described at, P. C. Kelires, Phys. Rev. B 55 (14), 8784 (1997), the content of which is incorporated herein by reference.

Figure 1:
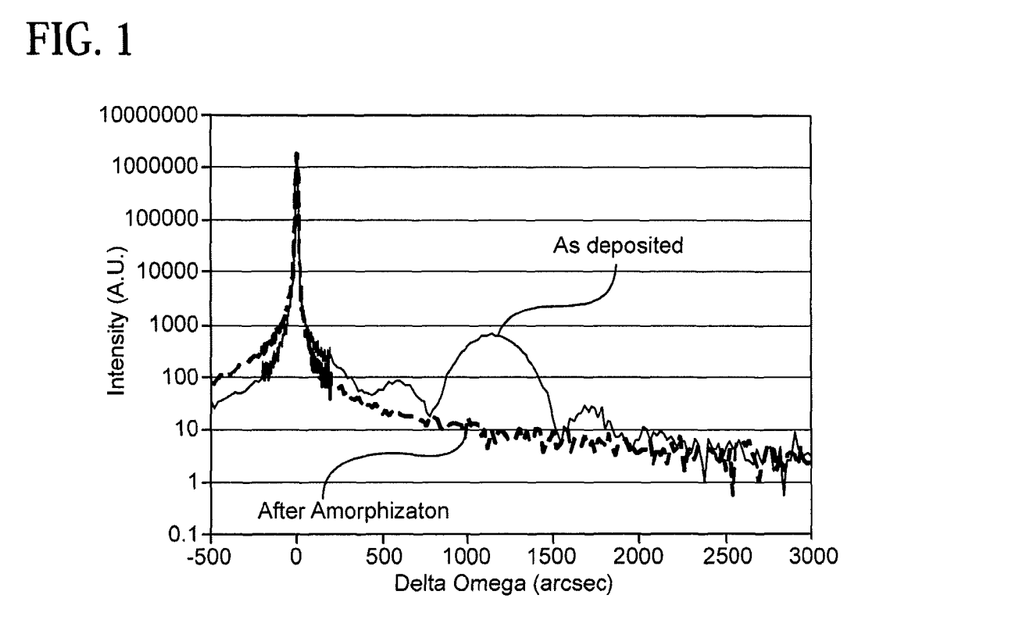
FIG. 1 is an HRXRD spectra showing structural change of an epitaxial layer containing silicon and carbon after amorphization.
Figure 2:
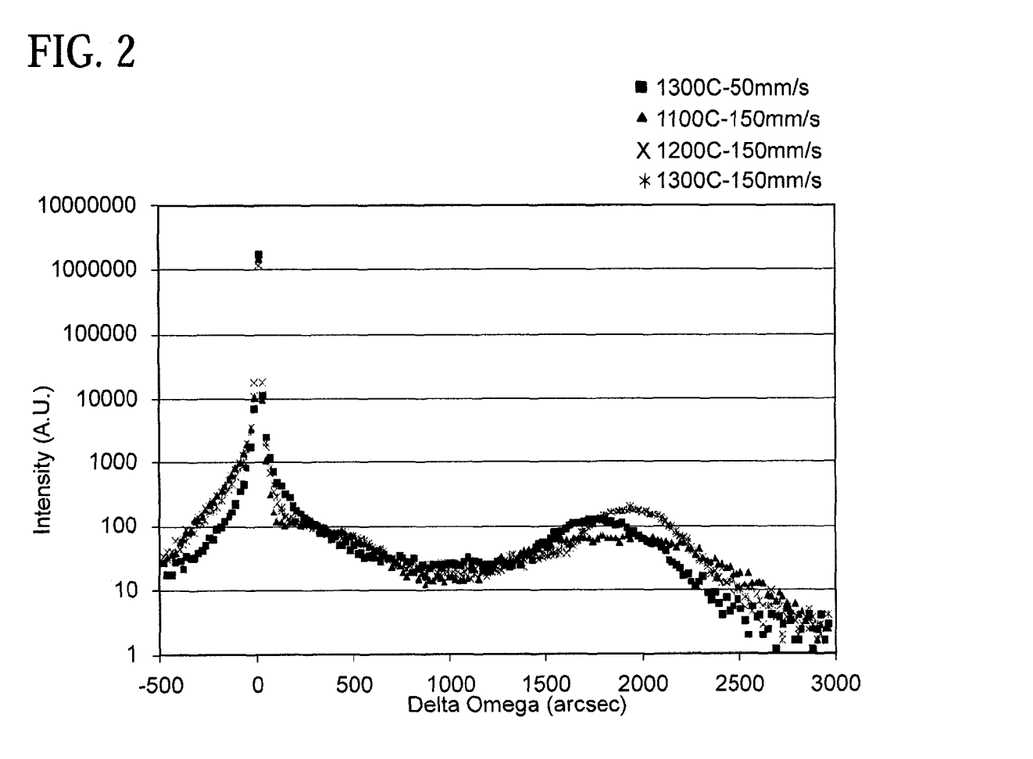
FIG. 2 is a HRXRD spectra showing structural change of an epitaxial layer containing silicon and carbon after amorphization and a surface anneal at temperatures between 1100 and 1300° C.
Figure 3:
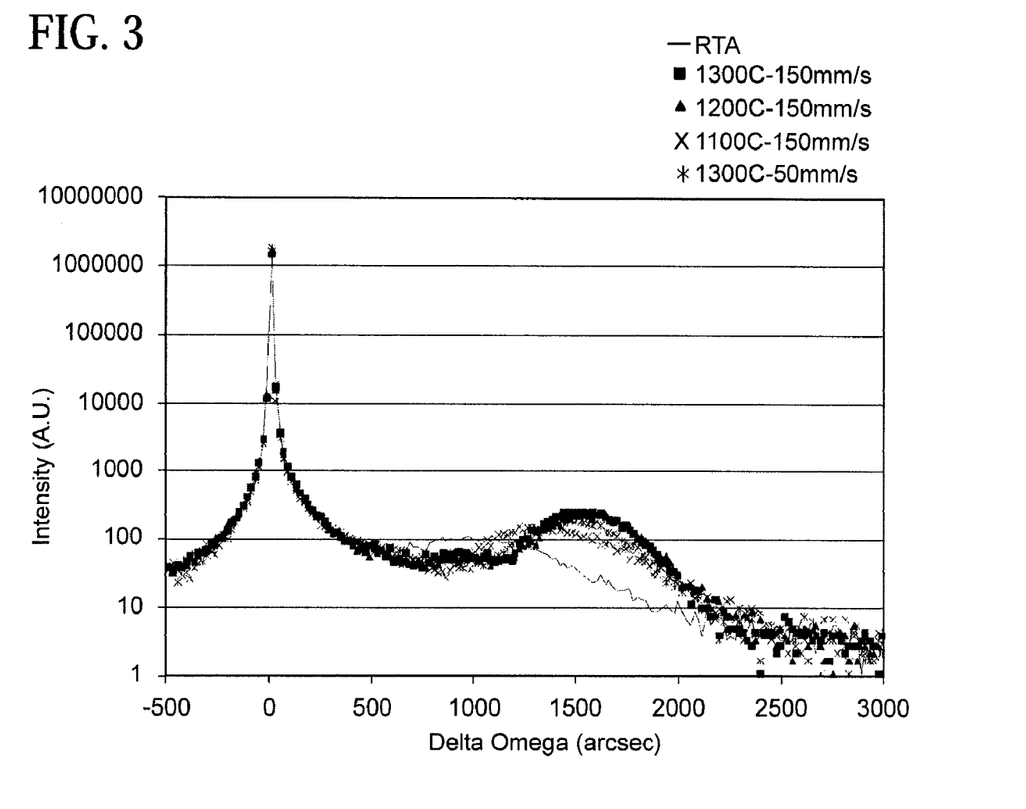
FIG. 3 is a HRXRD spectra showing structural change of an epitaxial layer containing silicon and carbon after amorphization and a surface anneal at temperatures between 1100 and 1300° C. and further processed for spike annealing.

FIG. 1 shows a high resolution x-ray diffraction (HR-XRD) scan after the Si implant yields no film peak, but only shows the reference Si peak at 0 arcsec corresponding to the Si substrate, indicating the absence of the initial crystalline Si:C epitaxial layer. The amorphized structure was then annealed in Applied Materials' Dynamic Surface Anneal system in the temperature range between 1100-1300° C. at the scanning speed of 150 mm/s or 50 mm/s (corresponding to dwell time of 0.5 ms or 1.5 ms). The resulting HRXRD is seen in FIG. 2, which shows the appearance of a peak around 2000, indicating crystalline layer formation of substitutional C of about 1.75% after the DSA. The sample Si wafer was further processed for spike annealing at 1050° C. in a 10% $O_2$ and 90% $N_2$ ambient using a Centura RTP. As seen in FIG. 3, the substitutional C level of the annealed (DSA+spike) samples is about 1.32% compared to as-deposited level of 1.04%.

Example 2

FIG. 2 shows the XRD of the same Si:C sample after dynamic surface anneal at temperatures between 1100 and 1300° C. and scanning speeds of 50-150 mm/s. A new film peak at 1800-2000 arcsec corresponding to 1.56-1.75% substitutional C appears after DSA. The observed 1.56-1.75% substitutional C is higher than the initial 1.04% substitutional C content in the as-deposited Si:C layer shown in FIG. 1.

Example 3

FIG. 3 shows HRXRD of Si:C layer after the proposed 3 step sequence followed by 1050° C. spike anneal. Peak position at 1500 arcsec indicates substitutional C content of 1.32%, higher than as-deposited content of 1.04% shown in FIG. 1. Sample processed through the above sequence without the dynamic surface anneal is labeled as "RTA" and shows film peak position below 1000 arcsec representing substitutional C less than 0.88%. Substitutional C received increased from as-implanted Si:C epi film, but increased substitutional C was not achieved by conventional spike anneal alone. Increased substitutional C was achieved with dynamic surface anneal or surface anneal followed by spike anneal.

Thus, this example demonstrates the increased substitutional C content in Si:C is maintained at the level above the as-deposited substitutional C content even after conventional dopant activation anneal at up to 1050° C. by following the above process sequence prior to activation anneal. According to one or more embodiments, a proposed overall process sequence to maintain increased substitutional C is Si:C epitaxial layer deposition, followed by amorphization by implantation, followed by dynamic surface anneal, or combination of dynamic surface anneal and spike anneal up to 1050° C.

Example 4

Figure 4:
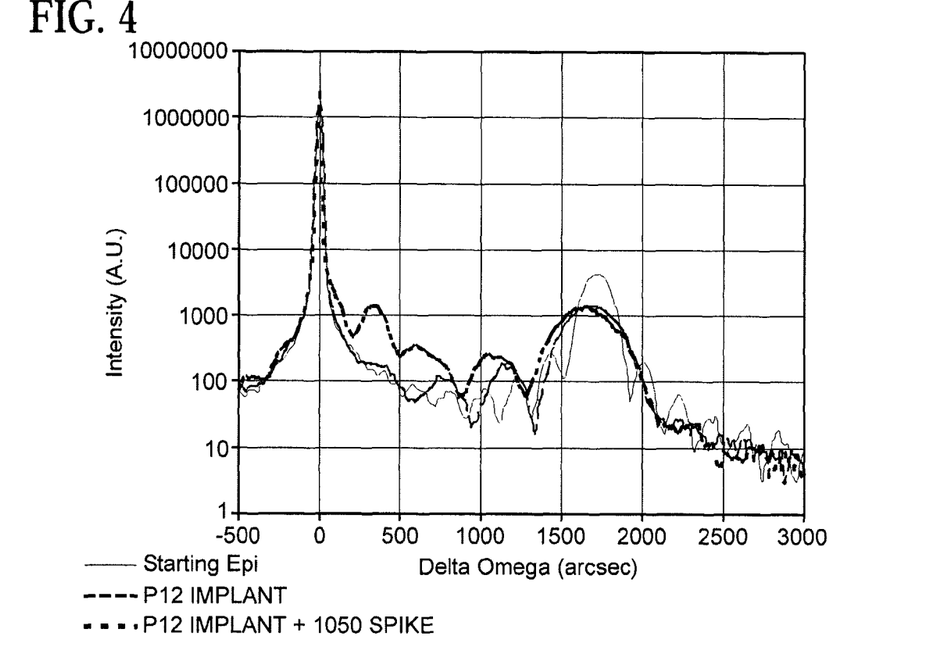
FIG. 4 shows HRXRD spectra of starting epitaxial layer after P12 keV, $4 \times 10^{15}/cm^2$ implant, and after 1050° C. spike anneal.

A 300 mm bare silicon wafer was placed in a 300 mm Epi Centura reduced pressure chamber, available from Applied Materials, Inc. of Santa Clara, Calif. A 1000 Å thick undoped Si:C epitaxial film was deposited on the 300 mm bare silicon wafer. As-deposited Si:C film contained approximately 1.5 atomic % total C, while 1.5 atomic % C is substitutional as indicated by film peak position around 1740 arcsec in high resolution X-ray diffractometer (HR-XRD) measurement in FIG. 4. Integrated substitutional C dose in the prepared epi film corresponds to $7.5 \times 10^{15}$/cm$^2$. The film was then subjected to phosphorous ion implantation at 12 keV ion energy and a dose of $4 \times 10^{15}$ cm$^2$ in Applied Materials' Quantum X implanter. The implant condition was chosen to dope the Si:C with appropriate source and drain junction depth. After implant, the top layer (~400 A in this case) was damaged and substitutional C was decreased in the damaged layer. Disappearance of fringes and broadening of the film peak indicate physical change of the film. Integrated substitutional C dose after the implantation was approximately $4 \times 10^{15}$/cm$^2$. The sample was then subject to a conventional anneal used in CMOS transistor fabrication, specifically, spike annealing at 1050° C. in 10% $O_2$/90% $N_2$ ambient in Applied Material's Radiance Plus. Appearance of peaks near the Si substrate peak indicates small amount of the lost substitutional C was recovered in the top layer by the spike anneal. The disappearance of fringes (after implant and spike anneal) above 1500 arcsec indicate loss of substitutional C and crystal damage on top layer. The corresponding integrated substitutional C was greater than $4 \times 10^{15}$/cm$^2$, but not greater than $5 \times 10^{15}$/cm$^2$.

Example 5

Figure 5:
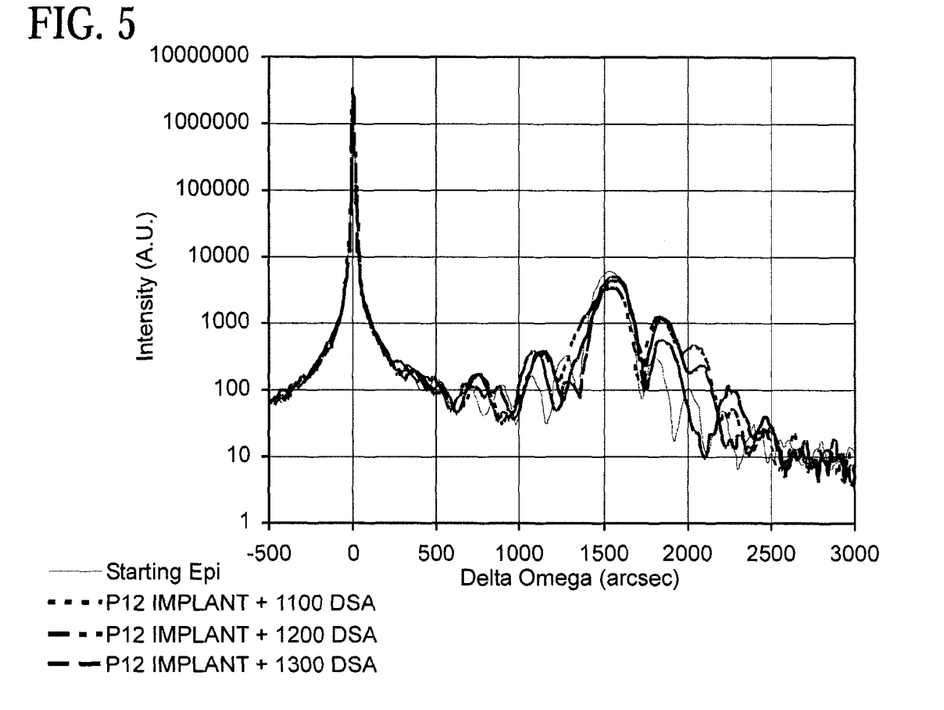
FIG. 5 shows HRXRD spectra of a starting epitaxial layer and treatment after P12 keV, $4e15/cm^2$ implant and dynamic surface anneal by millisecond laser annealing at 1100°, 1200° C. and 1300° C.

A starting Si:C epitaxial layer was prepared in the same method as in Example 4. The as-deposited Si:C film contained 1.42% total C, while 1.35% C was substitutional as indicated by film peak position around 1500 arcsec in high resolution X-ray diffractometer (HR-XRD) measurement in FIG. 5. Integrated substitutional C dose in the prepared epitaxial film corresponds to about $7 \times 10^{15}$/cm$^2$. The film was then subjected to the same implantation condition as in samples in Example 4 (phosphorous ion implantation at 12 keV ion energy and a dose of $4 \times 10^{15}$ cm$^2$ in Applied Materials' Quantum X implanter). After implant, the top layer (~400 A in this case) was damaged and substitutional C was decreased in the damaged layer, similar to Example 4. The sample was then subjected to millisecond annealing at temperature between 1100 and 1300° C. at scan speed of 150 mm/s using Applied Materials Dynamic Surface Anneal system. HRXRD in FIG. 5 shows strong fringes, especially above the of film peak at 1500 arcsec after millisecond annealing, indicating presence of high substitutional C. Corresponding substitutional C dose after millisecond annealing was about $7 \times 10^{15}$/cm$^2$ comparable to the substitutional C dose in the starting Si:C epi layer before implant and anneal.

Example 6

Figure 6:
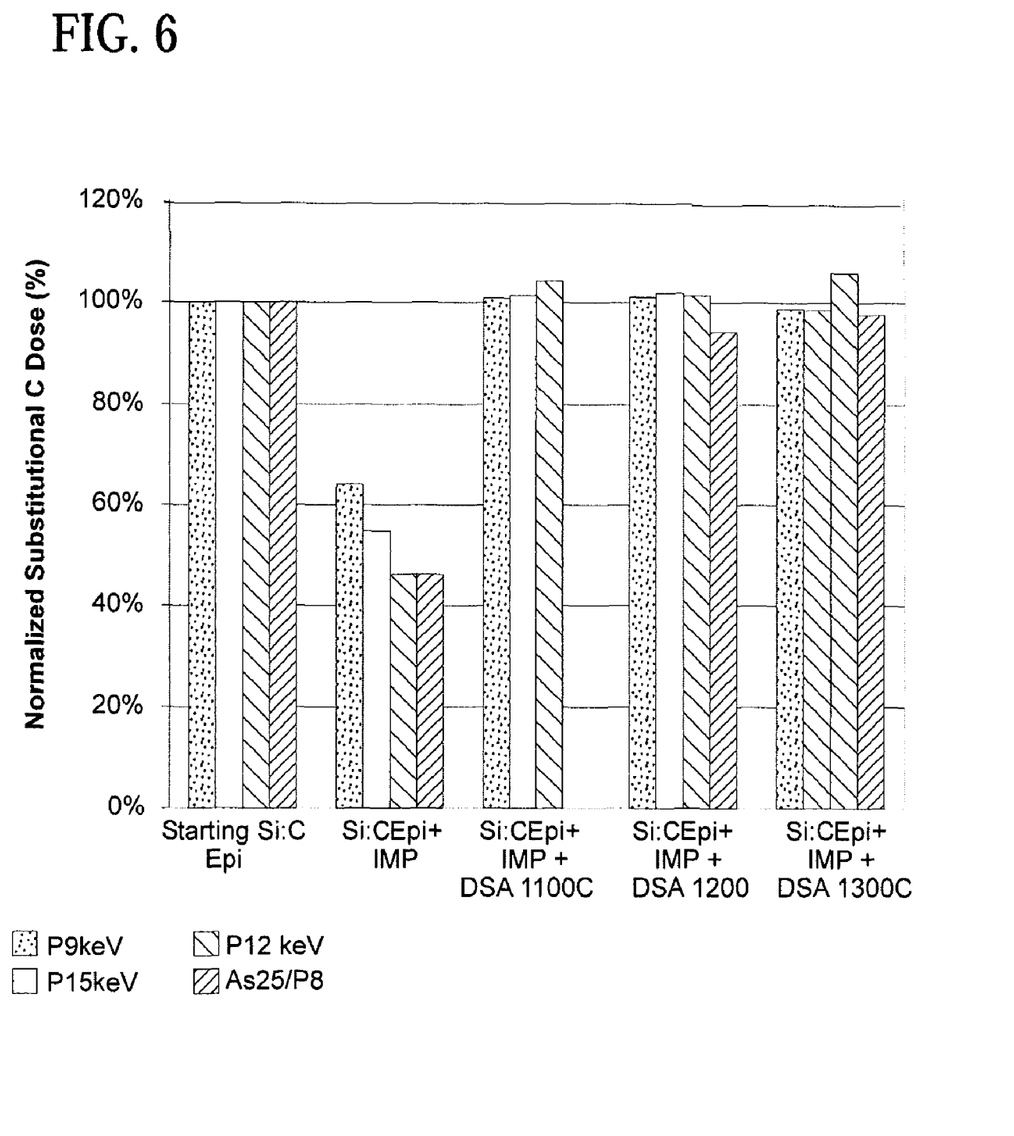
FIG. 6 shows normalized comparative substitutional C data for samples implantation with P only at various energy levels and a combination of As and P, and further processed by dynamic surface anneal between 1100° and 1300° C.

FIG. 6 shows the effect of Dynamic Surface annealing for several samples on substitutional carbon content. Samples were prepared with various implant conditions and annealed with DSA at temperature ranging from 1100° to 1300° C. FIG. 6 compares substitutional carbon content after implant and after the 3-step process sequence to the substitutional carbon content of an as-deposited epitaxial layer on 300 mm bare silicon wafers. For the sake of comparison, substitutional C in each film is integrated over the epi layer and expressed as dose and is normalized to the substitutional C dose in the as-deposited Si:C epitaxial film, thus, starting Si:C epi film was set to 100% in normalized substitutional C dose (y-axis in FIG. 6). Each of the wafers was placed in a 300 mm Epi Centura reduced pressure chamber, available from Applied Materials, Inc. of Santa Clara, Calif. A 1000 Å thick undoped Si:C epitaxial film was deposited on the 300 mm bare silicon wafers. Initial substitutional carbon content was measured. Each of the prepared Si:C epi film was subject to one of the following four implant conditions: (i) $4 \times 10^{15}/cm^2$ dose of P at 9 keV, (ii) $4 \times 10^{15}/cm^2$ dose of P at 12 keV, (iii) $4 \times 10^{15}/cm^2$ dose of P at 15 keV, or (iv) a combination of $2 \times 10^{15}/cm^2$ dose of P at 8 keV and $2 \times 10^{15}/cm^2$ dose of As at 25 keV. In fabricating nMOS transistors, implant condition can be chosen to meet the target source and drain junction location. For example, the P at 12 keV implant condition in Si:C will yield a junction with P concentration between $2 \times 10^{18}$ and $3 \times 10^{18}/$cm3 at about 600 Å from the surface. Lower energy will yield a shallower junction while high energy will yield a deeper junction. Thus, these four implant conditions were chosen to emulate HDD formation. Each sample implanted with one of the four conditions was then treated at different temperatures (1100° C., 1200° C., or 1300° C.) utilizing DSA at scan speed of 150 mm/s corresponding to 0.5 milisecond dwell time. For all implant conditions, substitutional C dose is decreased to 45-65% of the as-deposited dose after HDD implant, but is increased back to 94% or greater after DSA treatment, demonstrating effective recovery of substitutional C by DSA in Si:C layer.

Figure 7:
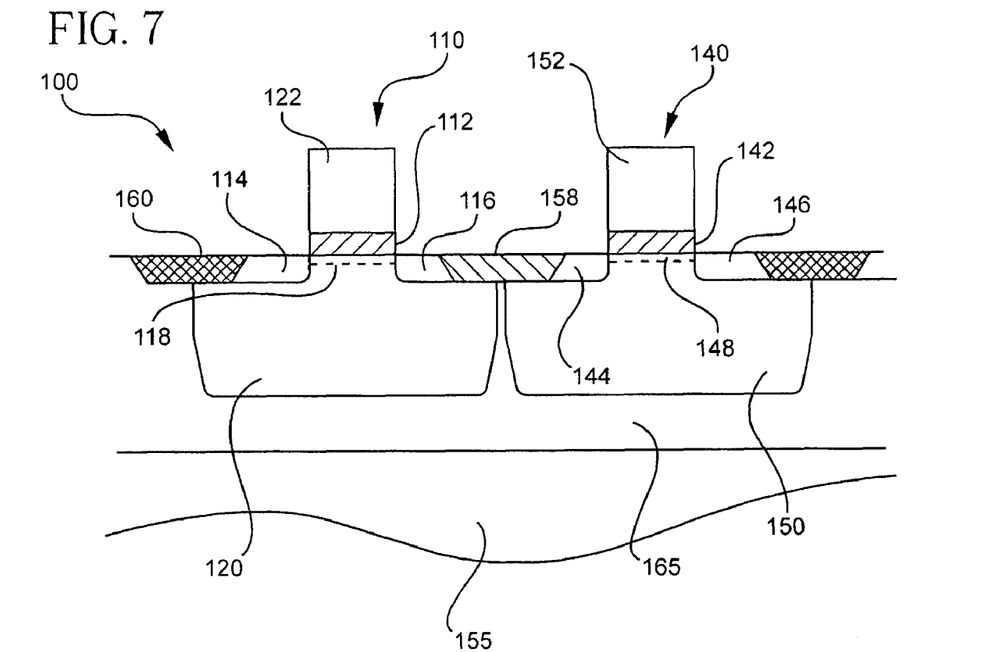
FIG. 7 is a cross-sectional view of a field effect transistor pair in accordance with an embodiment of the invention.

One or more embodiments of the present invention provide methods that are particularly useful in forming complementary metal oxide semiconductor (CMOS) integrated-circuit devices and will be described in that context. Other devices and applications are also within the scope of the invention. FIG. 7 illustrates portions of a cross sectional view of a FET pair in a typical CMOS device. Device 100 comprises a semiconductor substrate after forming wells to provide source/drain regions, gate dielectric, and gate electrode of an NMOS device and PMOS device. The device 100 can be formed using conventional semiconductor processes such as growing single crystal silicon and formation of shallow trench isolation structures by trench etching and growing or depositing dielectric in the trench openings. Detailed procedures for forming these various structures are known in the art and are not described further herein.

Device 100 comprises a semiconductor substrate 155, for example, a silicon substrate, doped with a p-type material, a p-type epitaxial silicon layer 165 on substrate 155, a p-type well region 120 and an n-type well region 150 defined in epitaxial layer 165, an n-type transistor (NMOS FET) 110 defined in p-well 120 and a p-type transistor (PMOS FET) 140 defined in n-well 150. First isolation region 158 electrically isolates NMOS 110 and PMOS 140 transistors, and second isolation region 160 electrically isolates the pair of transistors 110 and 140 from other semiconductor devices on substrate 155.

According to one or more embodiments of the invention, NMOS transistor 110 comprises a gate electrode 122, first source region 114 and a drain region 116. The thickness of the NMOS gate electrode 122 is scalable and may be adjusted based on considerations related to device performance. NMOS gate electrode 122 has a work function corresponding to the work function of a N-type device. The source and drain regions are n-type regions on opposite sides of the gate electrode 122. Channel region 118 is interposed between source region 114 and drain region 116. A gate dielectric layer 112 separates channel region 118 and gate electrode 122. Processes for forming the NMOS gate electrode 122 and dielectric layer are known in the art and are not discussed further herein. It will be understood that according to embodiments of the invention a Si:C epilayer would fill a portion of or the entire source/drain region 114 or 116.

According to one or more embodiments, PMOS transistor 140 comprises a gate electrode 152, a source region 144 and a drain region 146. The thickness of the PMOS gate electrode 152 is scalable and may be adjusted based on considerations related to device performance. PMOS gate electrode 152 has a work function corresponding to the work function of a N-type device. The source and drain regions are p-type regions on opposite sides of gate electrode 152. Channel region 148 is interposed between source region 144 and drain region 146. A gate dielectric 142 separates channel region 148 and gate electrode 152. Dielectric 142 electrically insulates gate electrode 152 from channel region 148. It will be appreciated that the structures of the transistors 110 and 140 shown in FIG. 4 and described immediately above are exemplary only, and various variants in materials, layers, etc. are within the scope of the present invention.

Figure 8:
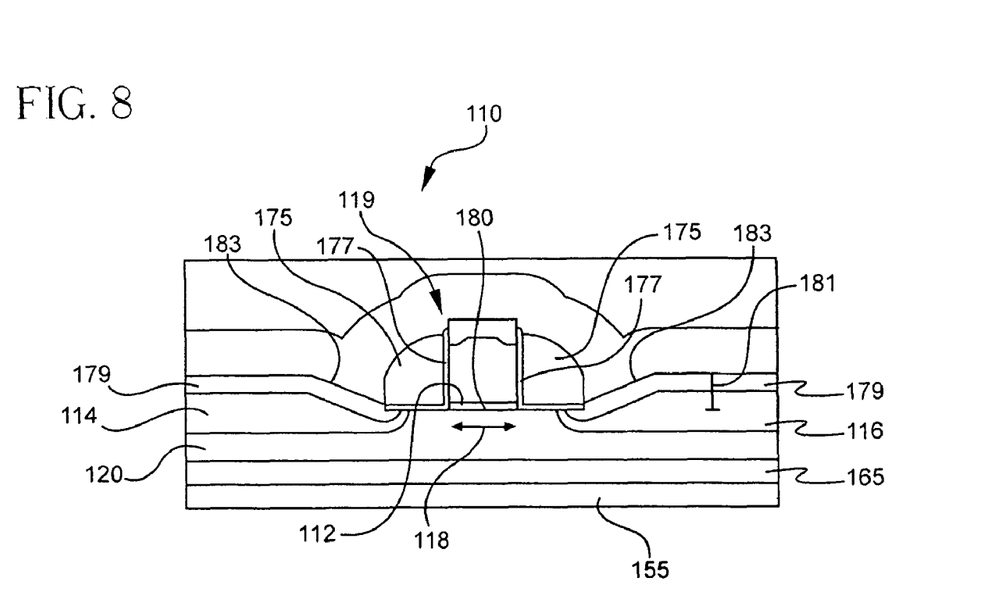
FIG. 8 is a cross-sectional view of the NMOS field effect transistor shown in FIG. 1 having additional layers formed on the device.

Referring now to FIG. 8, which shows a view of additional details of the NMOS device 110 of FIG. 7 after formation of spacers, layers over the source/drain regions, for example, silicide layers, and formation of the etch stop. It will be appreciated that the PMOS device shown in FIG. 4 may contain similar spacers and layers that may be tailored in dimensions and/or composition to affect the stress induced in the channel of the NMOS device as will be described further below. However, for illustration purposes, only NMOS device is shown and described in detail.

FIG. 8 shows spacers 175 that may be formed from suitable dielectric material incorporated around the gate 119. Offset spacers 177 may also be provided, which surround each of the spacers 175. Processes for forming shapes, sizes, and thickness of spacers 175 and 177 are known in the art and are not further described herein. A metal silicide layer 179 may be formed over the source region 114 and drain region 116. The silicide layer 179 may be formed from a suitable metal such as nickel, titanium, or cobalt by any suitable process such as sputtering or PVD (Physical Vapor Deposition). The silicide layer 179 may diffuse into portions of the underlying surfaces. Elevation of the drain region 116 is shown by the arrow 181, which is shown as the distance from the substrate surface 180 to the top of the silicide layer 179. Facet 183 of source drain region is shown as the angled surface As will be understood by the skilled artisan, the exemplary device described above may be modified to include a source/drain or source/drain extension having a Si:C epitaxial layer that may be further modified according to the methods described herein. Thus, embodiments of the present invention provide methods of maximizing substitutional C in Si:C layer by following sequence by recovering substitutional C after implantation. A process sequence according to one embodiments includes: Si:C epitaxial deposition followed by HDD or deep S/D implant followed by millisecond anneal. In specific embodiments, the starting epitaxial layer contains substitutional C equal or greater than about 1 atomic %, and the final epitaxial layer after the implant/anneal sequence contains substitutional C equal or greater than about 1 atomic %. In one or more embodiments, the integrated C dose in the final epitaxial layer after annealing is at least about 90% of the starting epitaxial layer.

Implantation can involve formation of nMOS deep source/drain, which is also known as "HDD" highly doped drain.

Exemplary implant conditions may include P only, As/P co-implant, or As only. Specific examples are P only: 6-15 keV; As: 25 keV/P:8 keV, As only: 25 keV and higher. Total dose around $4\times10^{15}/cm^2$. The N-type implant may be accompanied by additional pre-amorphization implantation (e.g., Si) in the transistor fabrication flow (this may be during or prior to HDD step), which result in amorphization of at least a portion of the epitaxial layer. While the present invention is not intended to be bound by a particular theory, implantation causes epitaxial film damage and reduces substitutional C in at least a portion of the epitaxial film. As a result, integrated substitutional C in the as deposited film exceed substitutional C after implant.

Upon annealing the epitaxial film after implantation, for example, by milli-second anneal, substitutional C increases from the after-implant level, resulting in a final substitutional C that can be less than, comparable to, or greater than as-deposited substitutional C level. As noted above, the anneal sequence can be varied. For example, a lower temperature spike anneal can be inserted in the in the sequence such as in the following sequence, but not limited to: Si:C epitaxial deposition followed by HDD or deep S/D implant followed by lower temperature anneal followed by millisecond anneal. In another example, a spike anneal can be added after milli-second anneal in such sequence: Si:C epitaxial deposition is followed by HDD or S/D implant followed by DSA followed by a spike anneal.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments. The order of description of the above method should not be considered limiting, and methods may use the described operations out of order or with omissions or additions.

It is to be understood that the above description is intended to be illustrative, and not restrictive. Many other embodiments will be apparent to those of ordinary skill in the art upon reviewing the above description. The scope of the invention should, therefore, be determined with reference to the appended claims, along with the full scope of equivalents to which such claims are entitled.

The invention claimed is:

1. A method of treating a Si:C epitaxial layer on a substrate comprising:
   providing a substrate having an epitaxial layer containing carbon and silicon deposited on the substrate, the carbon including substitutional carbon at a first integrated dose;
   ion implanting the epitaxial layer, causing a loss in substitutional carbon to a second integrated dose below the first integrated dose; and
   annealing the substrate and epitaxial layer at a temperature from about 1000° C. to about 1350° C. for a time of less than about 900 milliseconds to increase substitutional carbon from the second integrated dose to at least about 90% of the first integrated dose.

2. The method of claim 1, wherein the amount of substitutional carbon in the layer prior to ion implanting is in the range of about 0.5 and 2 atomic percent.

3. The method of claim 1, wherein the amount of substitutional carbon in the epitaxial layer prior to ion implanting is greater than about 1 atomic %.

4. The method of claim 1, wherein the ion implanting includes an element selected from P, As, Si, and combinations thereof at a dose of at least about $1.5\times10^{15}/cm^2$.

5. The method of claim 4, wherein the ion implanting results in amorphization of at least a portion of the epitaxial layer.

6. The method of claim 1, wherein annealing is performed by one or both of laser annealing and millisecond annealing.

7. The method of claim 6, wherein the annealing performed for less than 900 milliseconds is followed by rapid thermal annealing for less than 10 seconds.

8. The method of claim 6, wherein the annealing is performed by rapid thermal annealing for less than 10 seconds followed by laser annealing or millisecond annealing for less than 900 milliseconds.

9. The method of claim 1, wherein the Si:C epitaxial film is formed during a fabrication step of transistor manufacturing process, and the method further comprises:
   forming a gate dielectric on a substrate;
   forming a gate electrode on the gate dielectric;
   forming source/drain regions on the substrate on opposite sides of the electrode and defining a channel region between the source/drain regions; and
   depositing the epitaxial layer containing silicon and carbon directly on the source/drain regions.

10. The method of claim 9, wherein the amount of substitutional carbon in the layer prior to ion implanting is in the range of about 0.5 and 2 atomic percent.

11. The method of claim 9, wherein the amount of substitutional carbon in the epitaxial layer prior to implanting is greater than about 1 atomic %.

12. The method of claim 9, wherein ion implanting includes an element selected from P, As, Si, and combinations thereof at a dose of at least about $1.5\times10^{15}/cm^2$.

13. The method of claim 9, wherein the ion implanting results in amorphization of at least a portion of the epitaxial layer.

14. The method of claim 13, wherein the annealing performed for less than 900 milliseconds is followed by rapid thermal annealing for less than 10 seconds.

15. The method of claim 13, wherein rapid thermal annealing is performed for less than 10 seconds followed by the annealing performed for less than 900 milliseconds.

16. The method of claim 9, wherein ion implantation is performed to form a heavily doped drain using an element selected from P, As, and combinations thereof at a dose of at least about $1.5\times10^{15}/cm^2$.

17. The method of claim 9, wherein the transistor includes an nMOS transistor having a channel and the method increases tensile train in the channel of the nMOS transistor.

18. The method of claim 1, wherein the annealing is performed for less than 5 milliseconds.

19. The method of claim 18, wherein the annealing is performed for about 0.5 milliseconds.

20. The method of claim 1, wherein the amount of substitutional carbon in the epitaxial layer following annealing is greater than about 1 atomic %.

21. The method of claim 1, wherein the amount of substitutional carbon in the epitaxial layer prior to implanting and following annealing is greater than about 1 atomic %.

22. The method of claim 1, wherein the integrated dose of substitutional carbon following annealing is substantially equal to or greater than the first integrated dose of substitutional carbon prior to implanting.

* * * * *